(12) United States Patent
Yoon

(10) Patent No.: US 7,786,542 B2
(45) Date of Patent: Aug. 31, 2010

(54) DUAL IMAGE SENSOR AND MANUFACTURING METHOD THEREOF

(75) Inventor: Joon-Ku Yoon, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 189 days.

(21) Appl. No.: 12/233,646

(22) Filed: Sep. 19, 2008

(65) Prior Publication Data
US 2009/0115012 A1    May 7, 2009

(30) Foreign Application Priority Data
Nov. 5, 2007    (KR)    ...... 10-2007-0112016

(51) Int. Cl.
*H01L 31/0232*   (2006.01)
(52) U.S. Cl. ............... 257/432; 257/436; 257/E31.127; 438/65
(58) Field of Classification Search ......... 257/432, 257/436, E31.127; 438/65
See application file for complete search history.

(56) References Cited

U.S. PATENT DOCUMENTS

| | | | |
|---|---|---|---|
| 6,731,882 B1 * | 5/2004 | Althaus et al. ............. 398/139 |
| 7,138,663 B2 * | 11/2006 | Hoshuyama ................ 257/98 |
| 7,148,078 B2 * | 12/2006 | Moyer et al. .................. 438/65 |
| 7,245,324 B2 * | 7/2007 | Namazue et al. ............ 348/340 |
| 2003/0179457 A1 * | 9/2003 | Dobashi et al. ............. 359/619 |
| 2004/0227058 A1 * | 11/2004 | Spears et al. ............. 250/208.1 |
| 2009/0320913 A1 * | 12/2009 | Smith et al. ................. 136/255 |

* cited by examiner

*Primary Examiner*—Allan R Wilson
(74) *Attorney, Agent, or Firm*—Sherr & Vaughn, PLLC

(57) ABSTRACT

Embodiments relate to a dual image sensor which includes a first device including a first wafer having a first inclined step, a first reflective face on an inclined plane on the first inclined step, at least one first microlens over a lower end surface adjacent the first inclined step, and a first via-hole filled with metal on an upper end face adjacent the first inclined step. A second device in the dual image sensor includes a second wafer having a second inclined step, a second reflective face on an inclined plane on the second inclined step, and at least one second microlens over a first portion of an upper end face adjacent the second inclined step. A dual image sensor is formed by connecting the metal in the first via-hole and the metal in the second via-hole together. The dual image sensor is capable of imaging light incident from one or both sides as well as light incident in front or rear of the image sensor.

20 Claims, 3 Drawing Sheets

DUAL IMAGE SENSOR AND MANUFACTURING METHOD THEREOF

Figure 1:
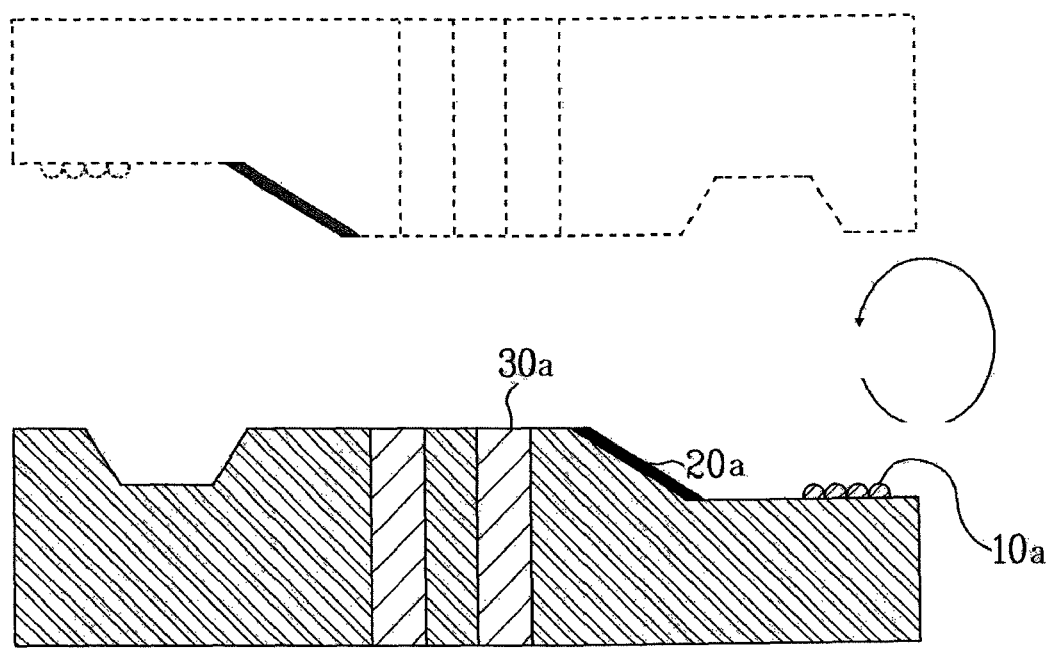

The present application claims priority under 35 U.S.C. 119 to Korean Patent Application No. 10-2007-0112016 (filed on Nov. 5, 2007), which is hereby incorporated by reference in its entirety.

BACKGROUND

Generally, an image sensor is a semiconductor device that converts an optical image into an electric signal. Image sensors may be classified into charge coupled devices (CCD) and complementary metal oxide semiconductor (CMOS) image sensors.

CMOS image sensors use a switching mechanism for detecting an output through MOS transistors. There is at least one MOS transistor for each pixel. The CMOS technology enables peripheral circuits, e.g., a control circuit and a signal processing circuit, to be simultaneously integrated. A CMOS image sensor consists of a photodiode and a plurality of MOS transistors. CMOS image sensors provide an image by basically converting light, i.e., visible ray incident in the front or rear of an image sensor chip, to an electric signal.

Eventually, it will be necessary to implement an image in three dimensions as the technology develops further. However, the structure of current image sensor chips only images the light incident to the front or rear thereof, which puts a limitation on the realization of 3-dimensional image.

SUMMARY

Embodiments relate to a semiconductor device, and more particularly, to a dual image sensor and manufacturing method thereof. Although embodiments are suitable for a wide scope of applications, they are particularly suitable for implementing the dual image sensor by the application of SIP (system in package) technology. Embodiments relate to a dual image sensor and manufacturing method thereof, by which 3-dimensional imaging can be realized using a single image sensor chip by applying SIP corresponding to microcircuit fabrication technologies of semiconductor devices. Embodiments relate to a dual image sensor and manufacturing method thereof, by which 3-dimensional imaging can be realized by a single image sensor capable of imaging light incident from one or both sides as well as light incident in front or rear of the image sensor.

Embodiments relate to a method of manufacturing a dual image sensor including forming a first device by forming a first inclined step inclined on a first wafer, forming a first reflective face on an inclined plane on the first inclined step to reflect light incoming from a lateral side, and forming at least a first microlens over a lower end face adjacent the first inclined step. The method includes forming a second device by forming a second inclined step inclined on a second wafer, forming a second reflective face on an inclined plane on the second inclined step to reflect the light incoming from the lateral side, and forming at least a second microlens over a first portion of an upper end face adjacent the second inclined step. The method includes forming a first via-hole on an upper end face adjacent the first inclined step and forming a second via-hole on a second portion of the upper end face of the second wafer, filling the first and second via-holes with metal, and connecting the metal within the first via-hole and the metal within the second via-hole together.

The second microlens may be arranged in a position to receive the light reflected by the first reflective face, and the first microlens may be arranged in a position to receive the light reflected by the second reflective face.

The first and second inclined steps may be formed by dry etching the first and second wafers, respectively, at an incline or angle.

Each of the first and second via-holes may be filled with a metal selected from the group consisting of Cu, W and Al. The first and second wafers may be attached by annealing the metal in the first and second via-holes. The upper end face on the first wafer may be aligned opposite said second portion of the upper end face of the second wafer. The first and second inclined steps are not aligned with each other when the first and second wafers are attached.

Embodiments relate to a dual image sensor which includes a first device including a first wafer having a first inclined step, a first reflective face on an inclined plane on the first inclined step, at least one first microlens over a lower end surface adjacent the first inclined step, and a first via-hole filled with metal on an upper end face adjacent the first inclined step. A second device in the dual image sensor includes a second wafer having a second inclined step, a second reflective face on an inclined plane on the second inclined step, and at least one second microlens over a first portion of an upper end face adjacent the second inclined step. A dual image sensor is formed by connecting the metal in the first via-hole and the metal in the second via-hole together.

The second microlens may be formed in a position to receive the light reflected by the first reflective face, and the first microlens may be in a position to receive the light reflected by the second reflective face.

The first reflective face may transfer the light incoming from a lateral side of the image sensor chip to the first microlens by reflecting the light and the dual image sensor of claim 10, and the second reflective face may transfer the light incoming from a lateral side of the image sensor chip to the first microlens by reflecting the light.

Accordingly, two wafers are implemented into a single image sensor chip and a lateral side of the image sensor chip is opened by a inclined step implemented on each of the wafers. Therefore, embodiments enable light incoming from the opened lateral side to be converted to an electric signal. Thus, embodiments can basically image the light incoming from one or both lateral sides of the image sensor chip as well as the light incoming in front or rear of the image sensor chip, thereby enabling a 3-dimensional picture configuration.

DRAWINGS

Example FIG. 1 is a cross-sectional diagram of a top device to implement a dual image sensor according to embodiments.

Figure 2:
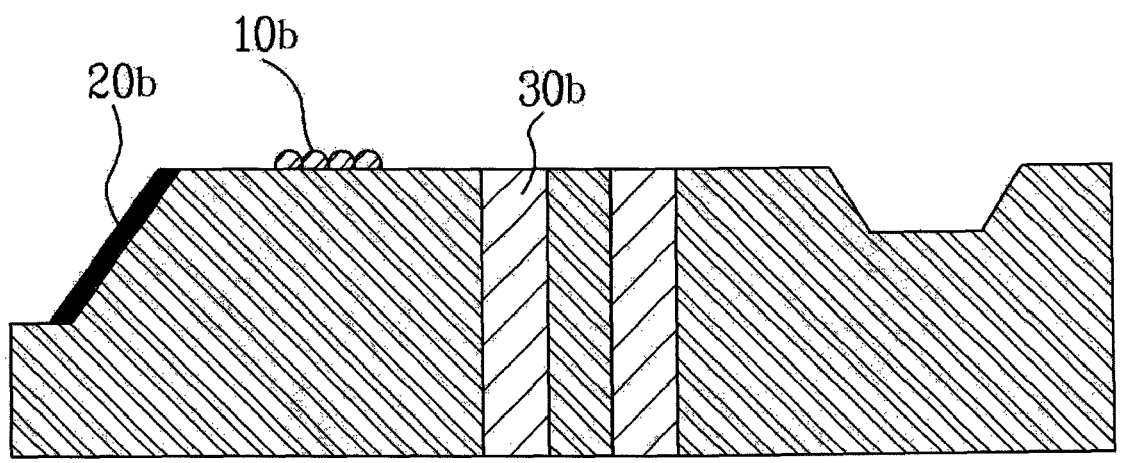

Example FIG. 2 is a cross-sectional diagram of a bottom device to implement a dual image sensor according to embodiments.

Figure 3:
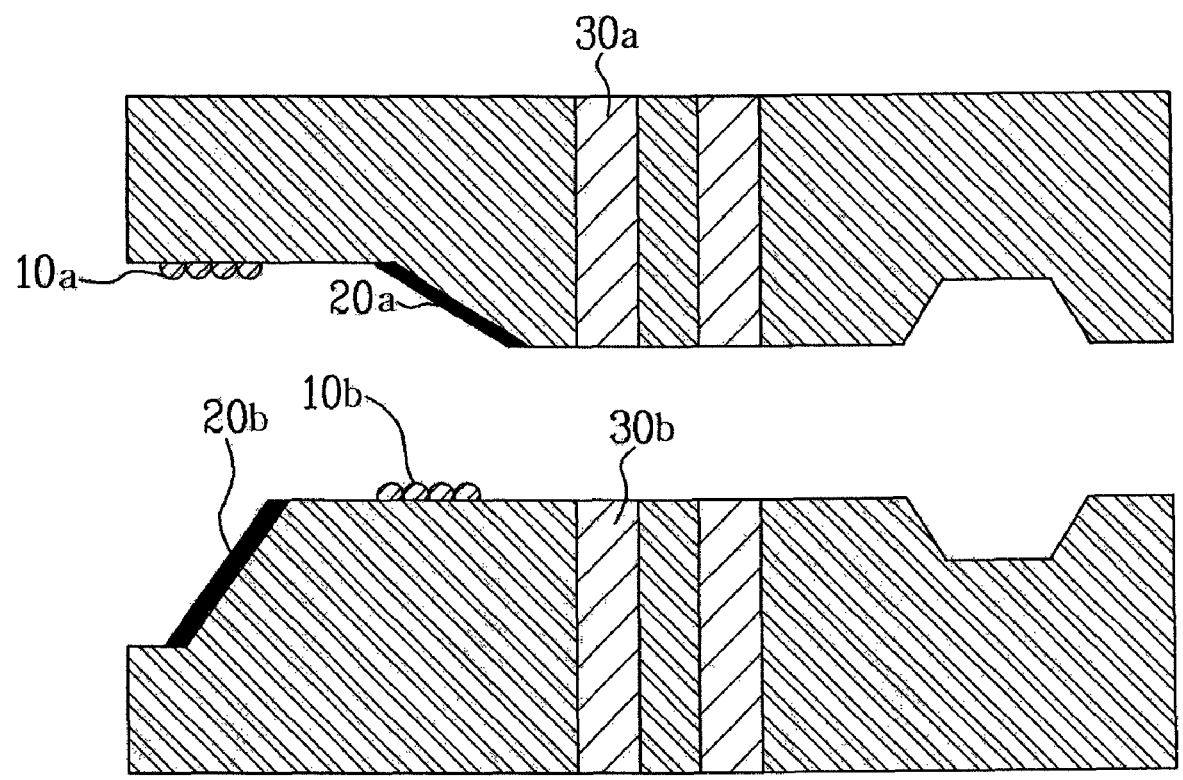

Example FIG. 3 is a cross-sectional diagram for an opposing structure of the top device shown in example FIG. 1 and the bottom device shown in example FIG. 2 to implement a dual image sensor according to embodiments.

Figure 4:
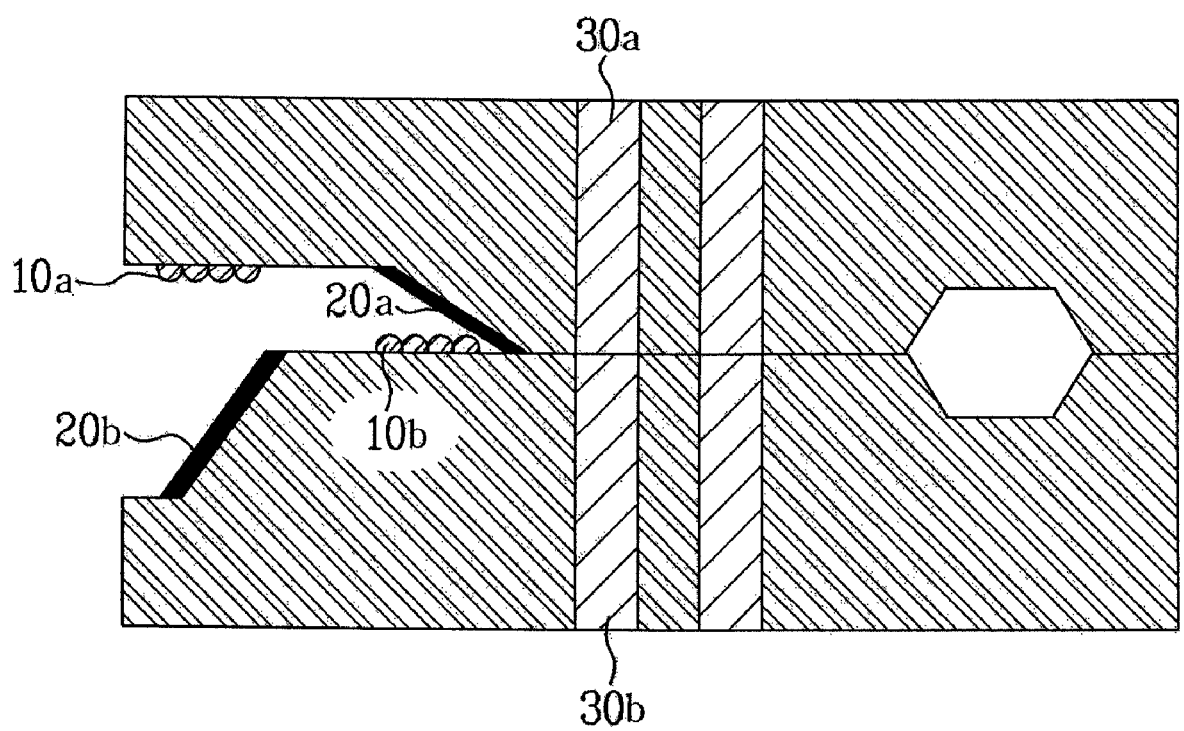

Example FIG. 4 is a cross-sectional diagram of the top device shown in example FIG. 1 and the bottom device shown in example FIG. 2 which are attached to each other in accordance with the opposing structure shown in example FIG. 3 to implement a dual image sensor according to embodiments.

DESCRIPTION

A dual image sensor and manufacturing method thereof according to embodiments are explained in detail with reference to the accompanying drawings as follows. A single image sensor chip may be implemented by attaching a plurality of wafers to each other. This may be accomplished by applying SIP micro circuit fabrication technology.

In particular, each of the wafers may have an inclined step height difference. Stepped faces of two wafers may be mounted opposed to each other to implement a single image sensor chip. In other words, two wafers may be mutually connected in a single package. The mutual connection between the two wafers may correspond to a circuit connection depending on the particular chip implementation. For the mutual connection between the two wafers, a via pattern may be provided to each of the wafers.

Example FIG. 1 is a cross-sectional diagram of a top device to implement a dual image sensor according to embodiments, and example FIG. 2 is a cross-sectional diagram of a bottom device to implement a dual image sensor according to embodiments. The top device shown in FIG. 1 and the bottom device shown in example FIG. 2 may be connected to each other by SIP technology, forming a single image sensor chip configuration. This configuration acts as one chip while using two wafers.

Referring to example FIG. 1, a process for forming a first device, for example, the top device, is explained as follows. A first step height difference with an inclined profile may be formed on a wafer. The first inclined step is formed by performing dry etch on the wafer at an angle or incline.

Subsequently, a first reflective face 20a may be formed on the first inclined step. The first reflective face 20a may be formed by depositing metal having relatively good reflectivity such as Ag, Ti and the like on the first inclined step. It is understood that the metal may be deposited, patterned and then etched to form the first reflective face 20a. The first reflective face 20a reflects the light incident from a lateral side of the sensor.

At least one microlens 10a may be formed over a lower end face adjacent the first inclined step. The microlens 10a may be formed by one of a plurality of related technologies and the precise details may be omitted in the following description.

A first relatively via-hole 30a may be formed in an upper end face adjacent the first inclined step. A metal, for example, Cu, W, Al or the like may be deposited by sputtering to enable the first via-hole 30a to be filled with the deposited metal. Planarization, for example using CMP (chemical mechanical polishing), may be performed to remove excess metal. A plurality of via-holes filled with metal may be formed at the same time and/or in a similar fashion to the first via-hole 30a.

Referring to example FIG. 2, a process for forming the second device, i.e., the bottom device is explained as follows. A second inclined step may be formed on another wafer. The second inclined step may be configured not to overlap with the first inclined step. In particular, when the first device on top and the second device on the bottom are attached to each other, each of the wafers may be dry etched so that the inclined plane on the first inclined step differs from the inclined plane on the second inclined step. For instance, the inclined plane adjacent the second inclined step may be placed closer to the center of the wafer than the inclined plane by the second step. In other words, the first and second inclined steps may be configured to be misaligned with each other. The second inclined step may be formed by dry etching at an angle or incline on the corresponding wafer.

A second reflective face 20b may be formed on the inclined plane adjacent the second inclined step. The second reflective face 20b may be formed by depositing metal having relatively good reflectivity, such as Ag, Ti and the like, over the inclined plane adjacent the second inclined step. The deposited metal may be patterned and then etched to form the second reflective face 20b. Like the first reflective face 20a, the second reflective face 20b reflects the light incident from a lateral side of the sensor.

At least one second microlens 10b may be formed over an upper end face by the second inclined step. The microlens 10b may be formed by one of a plurality of related technologies and the precise details may be omitted in the following description.

A second via-hole 30b may be formed in an upper end face, adjacent the second inclined step. A metal, for example Cu, W, Al or the like, may be deposited by sputtering to enable the second via-hole 30b to be filled with the deposited metal. Planarization, for example CMP (chemical mechanical polishing) may be performed to remove excess metal.

A plurality of metal pillars, each of which may be formed by filling the second via-hole 30 with metal, may be provided on the wafer. In particular, for the wafers shown in example FIG. 1 and example FIG. 2 to be attached to each other in a one-to-one correspondence, the number of the metal pillars on each of the two wafers may be equal.

Example FIG. 3 is a cross-sectional diagram for an opposing structure of the top device shown in example FIG. 1 and the bottom device shown in example FIG. 2 to implement a dual image sensor according to embodiments. Referring to example FIG. 3, if the top device shown in example FIG. 1 and the bottom device shown in example FIG. 2 are provided, the top and bottom devices are aligned to oppose each other.

Example FIG. 4 is a cross-sectional diagram of the top device shown in example FIG. 1 and the bottom device shown in example FIG. 2 which are attached to each other in accordance with the opposing structural relationship shown in example FIG. 3 to implement a dual image sensor according to embodiments. Referring to example FIG. 4, after the two devices have been aligned opposite each other, via-hole patterns of the two devices may be attached to each other. Therefore, the two devices are effectively combined into a single image sensor chip. For instance, annealing may be performed on the wafers of the two devices to attach the via-hole patterns. When the wafers are cooled, the metal pillars in the via-hole patterns of the two devices may be attached to each other correspondingly.

After the two devices are attached, the upper end face adjacent the first inclined step may be entirely attached to a portion of the upper end face by the second inclined step, and more particularly, to a portion of the upper end face adjacent the second inclined step, over which the second microlens 10b is not formed.

The areas of the wafers having the microlenses 10a and 10b can be defined as follows. When the wafers are aligned in opposition to each other, the second microlens 10b may be aligned to receive the light reflected from first reflective face 20a. The first microlens 10a may be aligned to receive the light reflected from the second reflective face 20b. A plurality of photodiodes may be provided within the wafers of the top and bottom devices, and aligned with the microlenses 10a and 10b, respectively. Each of the first and second reflective faces 20a and 20b may be inclined at an angle of approximately 45 degrees. Hence, the incident light incoming horizontally from a lateral side of the image sensor chip may be reflected vertically.

The structure of the image sensor chip configured by the above-described process may be summarized as follows. The first device includes the first reflective face 20a, the first microlens 10a and the first via-hole pattern 30a, which are formed on a wafer. Basically, the wafer is provided with the first inclined step and the first reflective face 20a is provided to the inclined plane on the first inclined step to reflect light. The at least one first microlens 10a may be provided to the lower end face adjacent the first inclined step. In particular, the first microlens 10a may be provided to the area at which the reflected light arrives from second reflective face 20b, on the lower end face adjacent the first inclined step. The first via-hole pattern 30a filled with metal for attachment to the second device may be formed on the upper end face adjacent the first inclined step.

The second device includes the second reflective face 20b, the second microlens 10b and the second via-hole pattern 30b, which may be formed on the corresponding wafer. The wafer of the second device has a second inclined step which, when the second device is attached to the first device, may be misaligned with the first inclined step of the first device.

The second reflective face 20b may be formed on the inclined plane adjacent the second inclined step to reflect light. And, the at least one second microlens 10b is formed on a portion of the upper end face adjacent the second inclined step. In particular, the second microlens 10b is formed on the area which receives light reflected by the first reflective face 20a. The second via-hole pattern 30b filled with metal for the attachment to the first device may be formed on the other portion of the upper end face adjacent the second inclined step, over which the second microlens 10b is not formed.

The above-configured first and second devices may be aligned opposite each other. The metals within the first and second via-hole pattern 30a and 30b may then be attached together. Therefore, the two wafers may be connected to effectively form a single image sensor chip.

The image sensor chip according to embodiments may be configured to have the lateral-side open structure by assembling a pair of the wafers having inclined reflective steps. Therefore, the incident light incoming from the open lateral side of the image sensor chip is reflected by the first and second reflective faces 20a and 20b and may then be delivered to the first and second microlenses 10a and 10b.

In the above description, one lateral side of the image sensor chip is open in embodiments as an example. These teachings also contemplate a device having both lateral sides of the image sensor chip to be open. In the above description, the configuration and manufacturing process for delivering the incident light incoming from the lateral side of the image sensor chip is provided as an example. Basically, it is understood that embodiments include configurations for transferring the incident light incoming from the front and rear of the image sensor chip. Therefore, details of the added configurations for transferring the incident light incoming from the front and rear of the image sensor chip are omitted.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming a first device by:
        forming a first inclined step on a first wafer,
        forming a first reflective face on an inclined plane on the first inclined step to reflect light incoming from a lateral side, and
        forming at least a first microlens over a lower end face adjacent the first inclined step; and
    forming a second device by:
        forming a second inclined step on a second wafer,
        forming a second reflective face on an inclined plane on the second inclined step to reflect the light incoming from the lateral side, and
        forming at least a second microlens over a first portion of an upper end face adjacent the second inclined step;
    forming a first via-hole on an upper end face adjacent the first inclined step and forming a second via-hole on a second portion of the upper end face of the second wafer;
    filling the first and second via-holes with metal; and
    connecting the metal within the first via-hole and the metal within the second via-hole together.

2. The method of claim 1, wherein the second microlens is arranged in a position to receive the light reflected by the first reflective face.

3. The method of claim 1, wherein the first microlens is arranged in a position to receive the light reflected by the second reflective face.

4. The method of claim 1, wherein the first inclined step is formed by dry etching the first wafer at an incline.

5. The method of claim 1, wherein the second inclined step is formed by dry etching the second wafer at an incline.

6. The method of claim 1, wherein the first via-hole is filled with a metal selected from the group consisting of Cu, W and Al.

7. The method of claim 1, wherein the second via-hole is filled with a metal selected from the group consisting of Cu, W and Al.

8. The method of claim 1, wherein the first and second wafers are attached by annealing the metal in the first and second via-holes.

9. The method of claim 1, wherein the upper end face on the first wafer is aligned opposite said second portion of the upper end face of the second wafer.

10. The method of claim 9, wherein the first and second inclined steps are not aligned with each other.

11. An apparatus comprising:
    a first device comprising:
        a first wafer having a first inclined step,
        a first reflective face on an inclined plane on the first inclined step,
        at least one first microlens over a lower end surface adjacent the first inclined step, and
        a first via-hole filled with metal on an upper end face adjacent the first inclined step; and
    a second device comprising:
        a second wafer having a second inclined step,
        a second reflective face on an inclined plane on the second inclined step,
        at least one second microlens over a first portion of an upper end face adjacent the second inclined step, and
        a second via-hole on a second portion of the upper end face of the second wafer, wherein a dual image sensor is formed by connecting the metal in the first via-hole and the metal in the second via-hole together.

12. The apparatus of claim 11, wherein the second microlens is in a position to receive the light reflected by the first reflective face.

13. The apparatus of claim 11, wherein the first microlens is in a position to receive the light reflected by the second reflective face.

14. The apparatus of claim 11, wherein the first reflective face transfers the light incoming from a lateral side of the image sensor chip to the first microlens by reflecting the light.

15. The apparatus of claim 11, wherein the second reflective face transfers the light incoming from a lateral side of the image sensor chip to the first microlens by reflecting the light.

16. The apparatus of claim 11, wherein the first via-hole is filled with a metal selected from the group consisting of Cu, W and Al.

17. The apparatus of claim 11, wherein the second via-hole is filled with a metal selected from the group consisting of Cu, W and Al.

18. The apparatus of claim 11, wherein the upper end face on the first wafer is aligned opposite said second portion of the upper end face of the second wafer.

19. The apparatus of claim 18, wherein the first and second inclined steps are not aligned with each other.

20. The apparatus of claim 11, wherein:

the second microlens is in a position to receive the light reflected by the first reflective face and the first microlens is in a position to receive the light reflected by the second reflective face;

the first reflective face transfers the light incoming from a lateral side of the image sensor chip to the first microlens by reflecting the light, and the second reflective face transfers the light incoming from a lateral side of the image sensor chip to the first microlens by reflecting the light;

the first and second via-holes are filled with a metal selected from the group consisting of Cu, W and Al; and the upper end face on the first wafer is aligned opposite said second portion of the upper end face of the second wafer, and the first and second inclined steps are not aligned with each other.

* * * * *